US012529968B2

(12) United States Patent
Yahata

(10) Patent No.: US 12,529,968 B2
(45) Date of Patent: Jan. 20, 2026

(54) SUBSTRATE TREATMENT SYSTEM AND SUBSTRATE TREATMENT METHOD

(71) Applicant: Tokyo Electron Limited, Tokyo (JP)

(72) Inventor: Keiichi Yahata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 89 days.

(21) Appl. No.: 18/707,280

(22) PCT Filed: Nov. 17, 2021

(86) PCT No.: PCT/JP2021/042178
§ 371 (c)(1),
(2) Date: May 3, 2024

(87) PCT Pub. No.: WO2023/089682
PCT Pub. Date: May 25, 2023

(65) Prior Publication Data
US 2025/0028256 A1    Jan. 23, 2025

(51) Int. Cl.
*G03F 7/00* (2006.01)
(52) U.S. Cl.
CPC ...... *G03F 7/70858* (2013.01); *G03F 7/70916* (2013.01)
(58) Field of Classification Search
CPC ............ G03F 7/70858; G03F 7/70916; G03F 7/70933; H01L 21/027; H01L 21/67017; H01L 21/67098; H01L 21/67248
See application file for complete search history.

(56) References Cited

U.S. PATENT DOCUMENTS

2009/0213343 A1*  8/2009  Sewell ............... G03F 7/70341
                                              73/31.04
2014/0030423 A1*  1/2014  Kubota .................. B05C 11/08
                                              118/696

FOREIGN PATENT DOCUMENTS

| JP | H09-129535 A | 5/1997 | |
| JP | 4689064 B2 * | 5/2011 | ......... G03F 7/70775 |
| JP | 2021-044453 A | 3/2021 | |
| KR | 1020150073667 A | 7/2015 | |
| KR | 1020190096819 A | 8/2019 | |

OTHER PUBLICATIONS

International Search Report of the International Searching Authority mailed Jan. 25, 2022 in corresponding International Application No. PCT/JP2021/042178 (and English translation).

* cited by examiner

*Primary Examiner* — Peter B Kim
(74) *Attorney, Agent, or Firm* — Posz Law Group, PLC

(57) ABSTRACT

A substrate treatment system connected to an exposure apparatus, includes: a substrate treatment apparatus configured to perform a treatment on a substrate; and a supply apparatus configured to supply atmosphere gas during a substrate treatment to the substrate treatment apparatus, wherein: the supply apparatus includes an intake part configured to take in emission gas emitted from the exposure apparatus; and the supply apparatus regulates a temperature and/or a humidity of the emission gas taken in from the intake part and then supplies the emission gas as the atmosphere gas to the substrate treatment apparatus.

10 Claims, 4 Drawing Sheets

SUBSTRATE TREATMENT SYSTEM AND SUBSTRATE TREATMENT METHOD

CROSS REFERENCE TO RELATED APPLICATION

This application is a U.S. national stage application of PCT/JP2021/042178 filed on Nov. 17, 2021, the contents of which are incorporated herein by reference.

TECHNICAL FIELD

This disclosure relates to a substrate treatment system and a substrate treatment method.

BACKGROUND ART

Patent Document 1 discloses a substrate treatment apparatus having a plurality of treatment units for treating a substrate, which has a plurality of ducts for supplying air to the treatment units and a connecting pipe connecting the duct and a supply source of air for each of the ducts, and supplies clean air to the treatment units by an air conditioner.

PRIOR ART DOCUMENT

Patent Document

Patent Document 1: Japanese Laid-open Patent Publication No. 2021-44453

DISCLOSURE OF THE INVENTION

Problems to Be Solved by the Invention

This disclosure reduces the required volume of clean air to be taken in by a supply apparatus when supplying atmosphere gas to a substrate treatment system by the supply apparatus.

Means for Solving the Problems

This disclosure is a substrate treatment system connected to an exposure apparatus, the substrate treatment system including:
  a substrate treatment apparatus configured to perform a treatment on a substrate; and
  a supply apparatus configured to supply atmosphere gas during a substrate treatment to the substrate treatment apparatus, wherein:
  the supply apparatus includes an intake part configured to take in emission gas emitted from the exposure apparatus; and
  the supply apparatus regulates a temperature and/or a humidity of the emission gas taken in from the intake part and then supplies the emission gas as the atmosphere gas to the substrate treatment apparatus.

Effect of the Invention

This disclosure reduces the required volume of clean air to be taken in by a supply apparatus when supplying atmosphere gas to a substrate treatment system by the supply apparatus.

EMBODIMENTS FOR CARRYING OUT THE INVENTION

Figure 1:
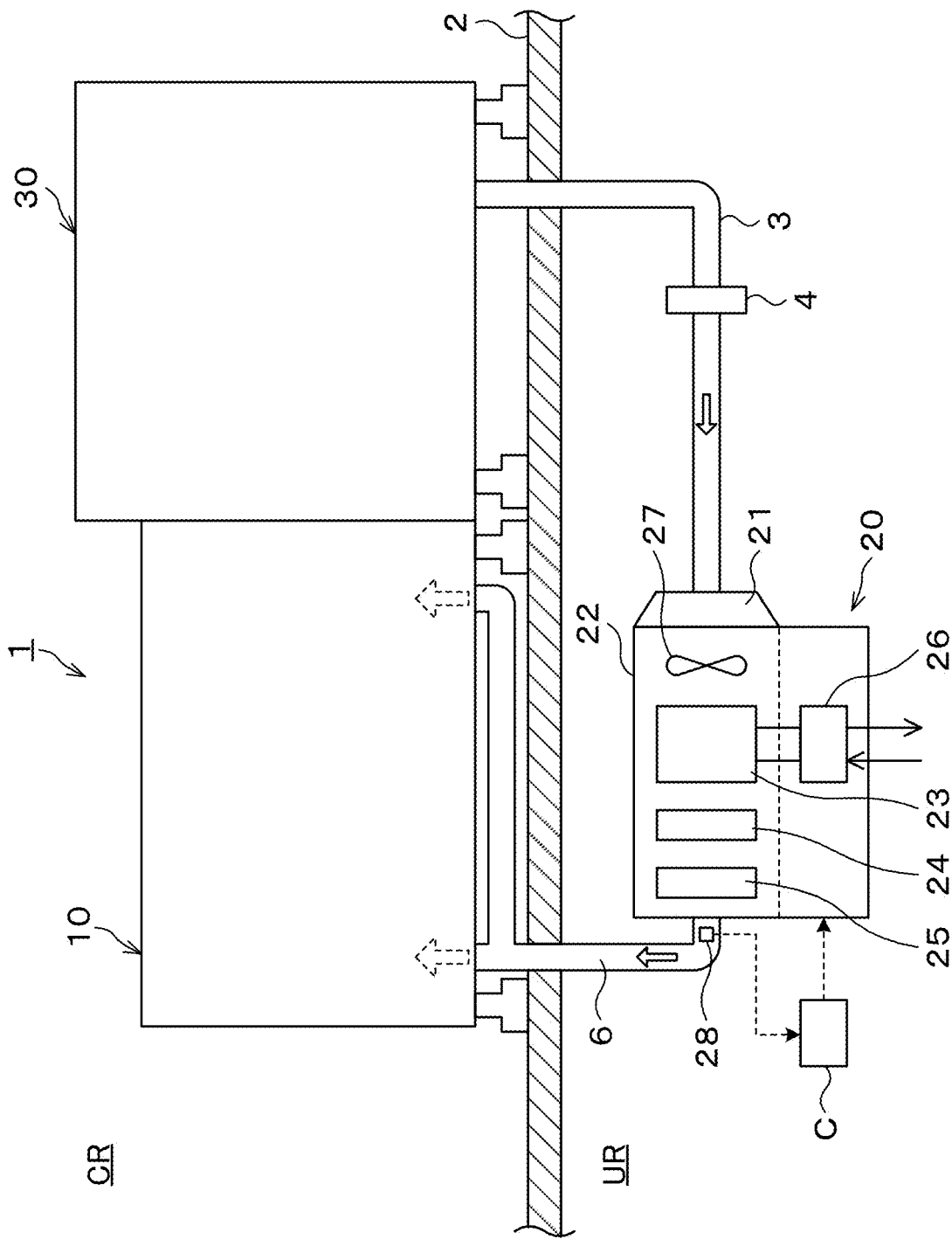
FIG. 1 is an explanatory view schematically illustrating a configuration of a substrate treatment system according to a first embodiment.

In a manufacturing process of a semiconductor device or the like, a resist solution is supplied onto a semiconductor wafer (hereinafter, referred to as a "wafer" in some cases) being a substrate to form a resist film, and thereafter patterns are formed on the resist film by an exposure apparatus. Then, the resist film is subjected to a developing treatment, whereby a series of photolithography processes is performed.

The formation and the developing treatment of the resist film are performed in a resist coating apparatus and a developing apparatus, respectively, and these apparatuses which perform necessary treatments other than an exposure treatment, together with other thermal treatment apparatus and the like are installed in a coating and developing treatment apparatus. In addition, the coating and developing treatment apparatus and the exposure apparatus are connected for use.

Here, for the resist coating apparatus and the developing apparatus, temperature and humidity environments for performing the coating treatment and the developing treatment are strictly decided. Therefore, the atmosphere in a clean room is not supplied as it is to these apparatuses, but is separately supplied from a supply apparatus which is provided in a lower space of a floor face on which, for example, the coating and developing treatment apparatus is installed, usually, a floor composed of a grating, namely, an underfloor space. This supply apparatus takes in the atmosphere in the underfloor space derived from a clean atmosphere in the clean room, regulates its temperature and humidity, and then supplies it as atmosphere gas to the resist coating apparatus and the developing apparatus.

On the other hand, the exposure apparatus is installed in connection with the coating and developing treatment apparatus, but clean air from another supply apparatus having a temperature and humidity regulation function dedicated for the exposure apparatus is supplied into the exposure apparatus. The supply apparatus dedicated for the exposure apparatus is also usually installed in the underfloor space, takes in the atmosphere in the underfloor space derived from the clean atmosphere in the clean room, regulates its temperature and humidity, and then supplies it as atmosphere gas to the exposure apparatus.

Both the coating and developing treatment apparatus and the exposure apparatus independently emit their emission gases to the outside of the clean room.

A source gas of the atmosphere gas to be supplied from each supply apparatus is the atmosphere in the underfloor space derived from the atmosphere in the clean room. The atmosphere in the clean room is regulated in temperature and humidity and highly cleaned by a high performance filter. Accordingly, suppression of its consumption as much as possible is preferable in terms of energy saving and cost, and can extend the life of the high performance filter.

In consideration of the above points, this disclosure reduces a required volume of clean air in an underfloor space or the like from which a supply apparatus takes in when supplying atmosphere gas to a substrate treatment system by the supply apparatus.

Hereinafter, a configuration of a substrate treatment system according to this embodiment will be explained with reference to the drawings. Note that, in the description, components having substantially the same functional configurations are denoted by the same reference signs to omit duplicate explanations.

FIG. 1 schematically illustrates the outline of a substrate treatment system 1 according to a first embodiment, and the substrate treatment system 1 has a coating and developing treatment apparatus 10 as a substrate treatment apparatus, and a supply apparatus 20. To the coating and developing treatment apparatus 10, an exposure apparatus 30 is connected. Note that the coating and developing treatment apparatus 10 and the exposure apparatus 30 may be directly connected as illustrated, or connected via an interface part which performs transfer and standby of a wafer between the coating and developing treatment apparatus 10 and the exposure apparatus 30.

The coating and developing treatment apparatus 10 and the exposure apparatus 30 are installed on an upper surface of a floor 2 in a clean room CR. The supply apparatus 20 is installed in an underfloor space UR being a lower space of the floor 2. The floor 2 is composed of a gas-permeable flooring material usually called grating. Accordingly, the atmosphere in the underfloor space UR is an atmosphere originating from the clean room CR. Thus, the atmosphere in an installation area in this disclosure includes not only the atmosphere in the clean room CR in which the coating and developing treatment apparatus 10, the exposure apparatus 30, and so on are installed but also the atmosphere in the underfloor space UR of the floor 2 on which the coating and developing treatment apparatus 10, the exposure apparatus 30, and so on are installed.

The supply apparatus 20 has an intake part 21 which takes in the emission gas emitted from the exposure apparatus 30. In the illustrated example, a duct 3 is provided between the intake part 21 and the exposure apparatus 30, so that exhaust gas emitted from an exhaust part (not illustrated) of the exposure apparatus 30 flows through the inside the duct 3 toward the intake part 21. Further, in the illustrated example, a remover 4 is provided which removes a foreign substance and/or a chemical substance contained in the emission gas from the exposure apparatus 30 before the taking into the intake part 21. The remover 4 is composed of, for example, a filter. Note that the duct 3 only needs to be a closed flow path through which gas flows without leakage regardless of its name, and may be, for example, a pipe or a tube.

The supply apparatus 20 regulates the temperature and humidity of the emission gas taken in from the intake part 21 and then supplies it as atmosphere gas to the coating and developing treatment apparatus 10. The supply apparatus 20 is, for example, an air conditioner. The supply apparatus 20 has a cooling part 23, a heating part 24, and a humidifying part 25 in order from the upstream, for example, in a flow path in a casing 22. The cooling part 23 is composed of, for example, a cooling coil. The cooling part 23 has, for example, a function of cooling the gas taken in from the intake part 21 to a dew-point temperature or lower with cooling water or a refrigerant supplied from a cooling device 26 to dehumidify the gas.

The cooling device 26 includes various instruments which realize a refrigeration cycle composed of, for example, a compressor, an expansion valve, and so on. For example, a heat pump composition may be employed. The illustrated cooling device 26 has a configuration of cooling the refrigerant increased in temperature in the refrigeration cycle, with cooling water (for example, 15° C. to 25° C.) supplied from the outside. Accordingly, the cooling water discharged from the cooling device 26 has been increased in temperature (for example, 25° C. to 35° C.). As a matter of course, the cooling device 26 is not limited to this configuration.

Examples of the heating part 24 include a heater functioning as a so-called reheater which generates heat by the supply of electric power and a heating coil which generates heat by the supply of hot water.

As the humidifying part 25, for example, a humidifier having a configuration which sprays water or supplies water vapor can be employed.

Through use of the above cooling part 23, heating part 24, and humidifying part 25, the gas taken in from the intake part 21 is first dehumidified by the cooling part 23, then heated by the heating part 24 up to a desired temperature, and thereafter humidified by the humidifying part 25 up to a desired humidity. The gas thus regulated to the desired temperature and humidity is supplied as the atmosphere gas by a fan 27 to the coating and developing treatment apparatus 10, for example, via a duct 6.

Note that the control of the cooling part 23, the heating part 24, and the humidifying part 25 may be performed by a control device C based on detection values of a temperature and humidity sensor 28 provided, for example, in the duct 6. Note that the supply apparatus 20 can perform regulation of only the temperature, regulation of only the humidity, or regulation of both of them.

Figure 2:
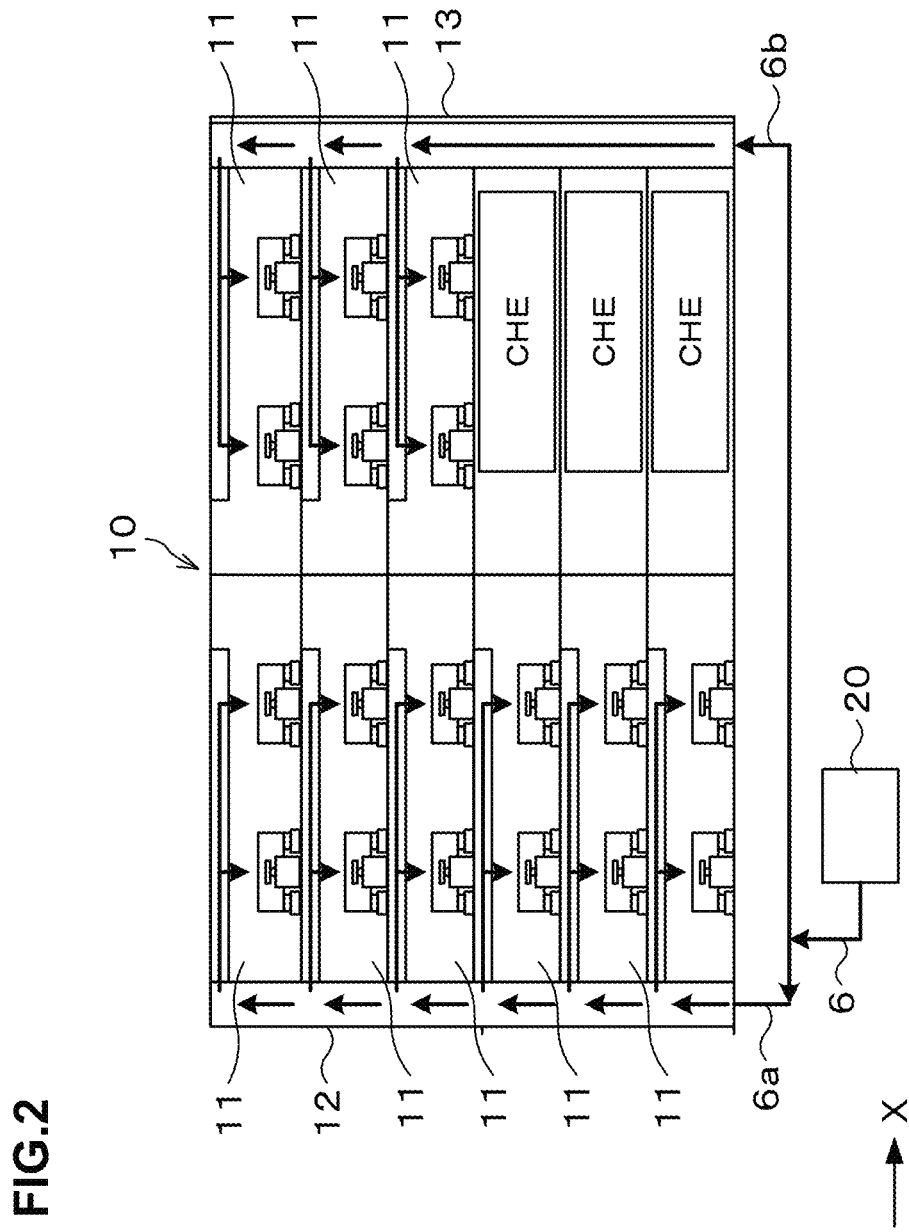
FIG. 2 is an explanatory view schematically illustrating an internal configuration of a substrate treatment apparatus in the substrate treatment system in FIG. 1.

The coating and developing treatment apparatus 10 has, for example, a configuration illustrated in FIG. 2, in which a plurality of treatment apparatuses 11 of a so-called liquid treatment system, for example, resist coating apparatuses and developing treatment apparatuses are installed at multiple stages. The atmosphere gas regulated in temperature and humidity by the supply apparatus 20 is supplied, for example, to a ceiling part at each stage by main ducts 12, 13 provided in the apparatus via ducts 6a, 6b branched from the duct 6. The atmosphere gas supplied to the ceiling part at each stage is individually supplied into each treatment apparatus 11. The temperature and humidity of the atmosphere gas are generally, for example, 23° C., 45% RH, but preferable temperature and humidity are not limited to them depending on the type and the details of the treatment of the treatment apparatus 11 at its supply destination.

Note that the coating and developing treatment apparatus 10 is equipped with a plurality of thermal treatment apparatuses for heating the wafer after the resist coating and thermal treatment apparatuses for heating the wafer after exposure, in addition to the treatment apparatuses 11 of the liquid treatment system.

The substrate treatment system 1 according to the embodiment has the above configuration. According to the substrate treatment system 1, the emission gas from the exposure apparatus 30 which is conventionally emitted as the exhaust as it is to the outside of the clean room CR is taken in by the supply apparatus 20 and regulated at least in temperature or humidity, and then supplied as the atmosphere gas to the coating and developing treatment apparatus 10. Therefore, the emission gas from the exposure apparatus 30 which is conventionally emitted as it is to the outside of the clean room CR can be effectively reused. The consumption of the atmosphere in the underfloor space UR originating from the clean room CR can be reduced accordingly from the conventional consumption. Therefore, the energy required for the generation of the clean air to be supplied into the clean room CR can be saved, and the life of the filter when cleaning can be extended.

Further, in the case where the load of the regulation in temperature or humidity of the emission gas from the exposure apparatus 30 is less than that of the regulation in temperature or humidity of the atmosphere in the underfloor space UR, it is also possible to reduce the energy required for the operation of the supply apparatus 20.

Incidentally, the emission gas from the exposure apparatus 30 may contain a particle and a chemical substance in some cases. According to the substrate treatment system 1 in the embodiment, the remover 4 which removes a foreign substance and/or a chemical substance contained in the emission gas is provided in the duct 3, so that the particle and chemical substance can be removed before the emission gas is taken into the intake part 21. Accordingly, even if a particle and a chemical substance are contained in the emission gas from the exposure apparatus 30, the supply apparatus 20 can preferably regulate the emission gas in temperature and humidity to generate the atmosphere gas.

Though all the source gas to be taken in from the intake part 21 is the emission gas from the exposure apparatus 30 in the above embodiment, such a case cannot be denied that the temperature and humidity of the emission gas exceed controllable ranges of the temperature and humidity regulation in the supply apparatus 20. A substrate treatment system 1 according to a second embodiment illustrated in FIG. 3 has a configuration which can cope with this case.

First of all, the intake part 21 has a first intake part 21a and a second intake part 21b. The first intake part 21a is provided with a damper D1 which can adjust the flow rate of the gas to be taken in. The second intake part 21b is provided with a damper D2 which can adjust the flow rate of the gas to be taken in. Further, the first intake part 21a is connected with the duct 3 which takes in the emission gas from the exposure apparatus 30. On the other hand, the second intake part 21b is configured to take in the atmosphere in the underfloor space UR.

With the above configuration, a mixed gas of the emission gas from the exposure apparatus 30 and the atmosphere in the underfloor space UR can be introduced as the source gas to be taken in by the supply apparatus 20. Accordingly, in the case where the source gas to be taken in by the supply apparatus 20 is based only on the emission gas from the exposure apparatus 30, if the source gas exceeds the controllable ranges of the temperature and humidity regulation in the supply apparatus 20, the opening degrees of the damper D1 of the first intake part 21a and the damper D2 of the second intake part 21b may be adjusted to mix the atmosphere in the underfloor space UR into the emission gas from the exposure apparatus 30. This can also regulate the source gas to fall within the controllable ranges of the temperature and humidity regulation in the supply apparatus 20.

Further, if the source gas to be taken in by the supply apparatus 20 does not fall within the controllable ranges of the temperature and humidity regulation in the supply apparatus 20 only by mixing the atmosphere in the underfloor space UR into the emission gas from the exposure apparatus 30, it is only necessary to close the damper D1 of the first intake part 21a so as to take in only the atmosphere in the underfloor space UR. As a matter of course, when the source gas fall within the controllable ranges of the temperature and humidity regulation in the supply apparatus 20 even if only the emission gas from the exposure apparatus 30 is taken in, it is only necessary to close the damper D2 of the second intake part 21b so as to take in only the emission gas from the exposure apparatus 30.

The opening degree adjustment of the damper D1 of the first intake part 21a and the damper D2 of the second intake part 21b may be performed in the initial setting at the start-up of the substrate treatment system 1 and the exposure apparatus 30.

Figure 3:
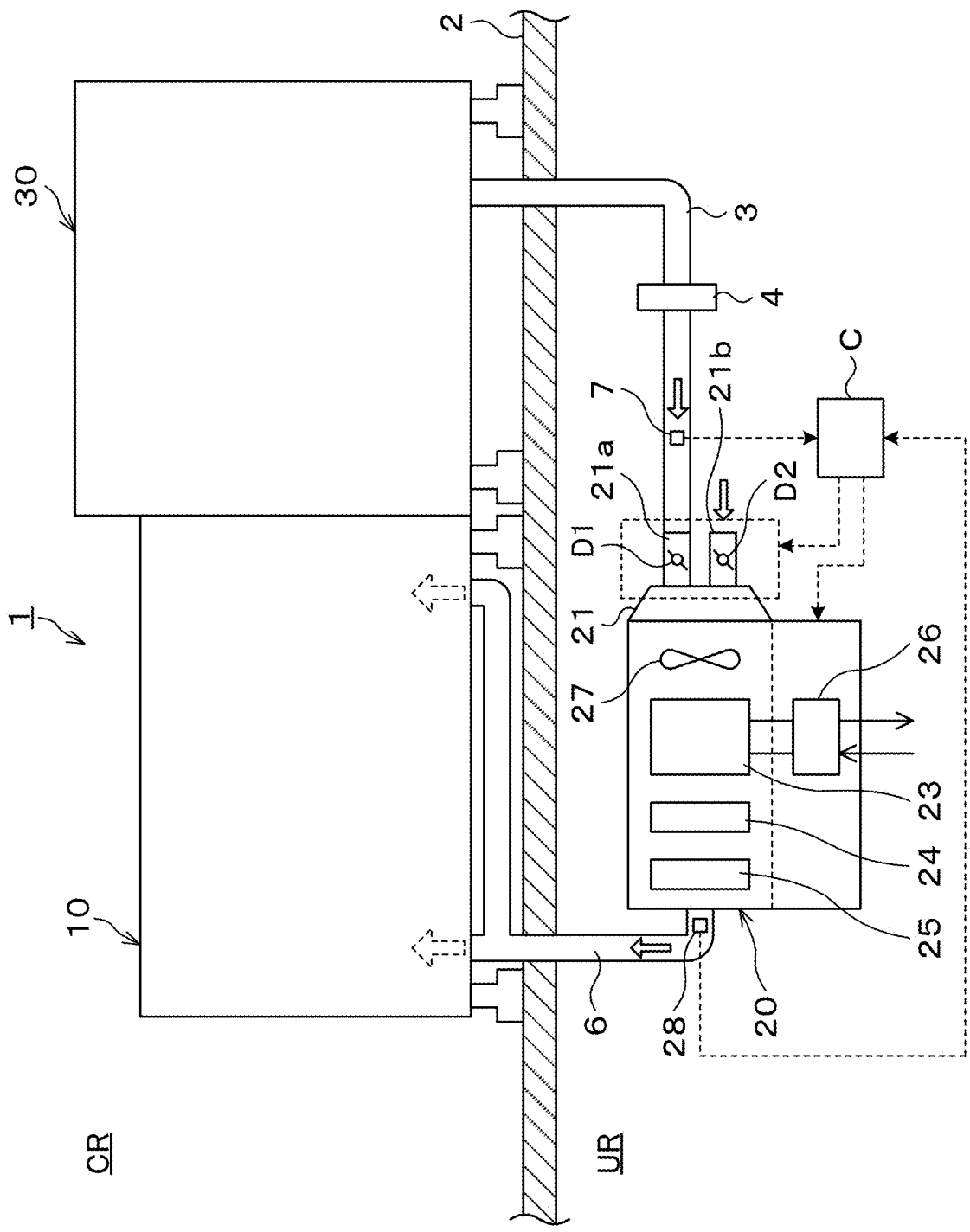
FIG. 3 is an explanatory view schematically illustrating a configuration of a substrate treatment system according to a second embodiment.

In this case, as illustrated in FIG. 3, a temperature and humidity sensor 7 is provided in the duct 3 to measure the temperature and humidity of the emission gas from the exposure apparatus 30, so that the opening degree adjustment of the damper D1 and the damper D2 may be performed by the control device C based on measurement values. This makes it possible to change the mixing ratio of the emission gas to be taken in from the first intake part 21a and the atmosphere to be taken in from the second intake part 21b. Further, it is also adoptable to select and take in either the emission gas to be taken in from the first intake part 21a or the atmosphere to be taken in from the second intake part 21b, based on the measurement values of the temperature and humidity sensor 7. The opening degree adjustment of the damper D1 and the damper D2 may be performed not only at the start-up of the substrate treatment system 1 and the exposure apparatus 30 but also sequentially or continuously during the operation of the substrate treatment system 1 and the exposure apparatus 30.

Incidentally, in the case of measuring the temperature and humidity of the emission gas from the exposure apparatus 30 and performing the opening degree adjustment of the damper D1 and the damper D2 based on their measurement values as in the example illustrated in FIG. 3, if the damper D1 of the first intake part 21a is tightened too much, the inside of the exposure apparatus 30 possibly lacks exhaust heat when the flow rate of the emission gas emitted from the exposure apparatus 30 becomes too low.

Figure 4:
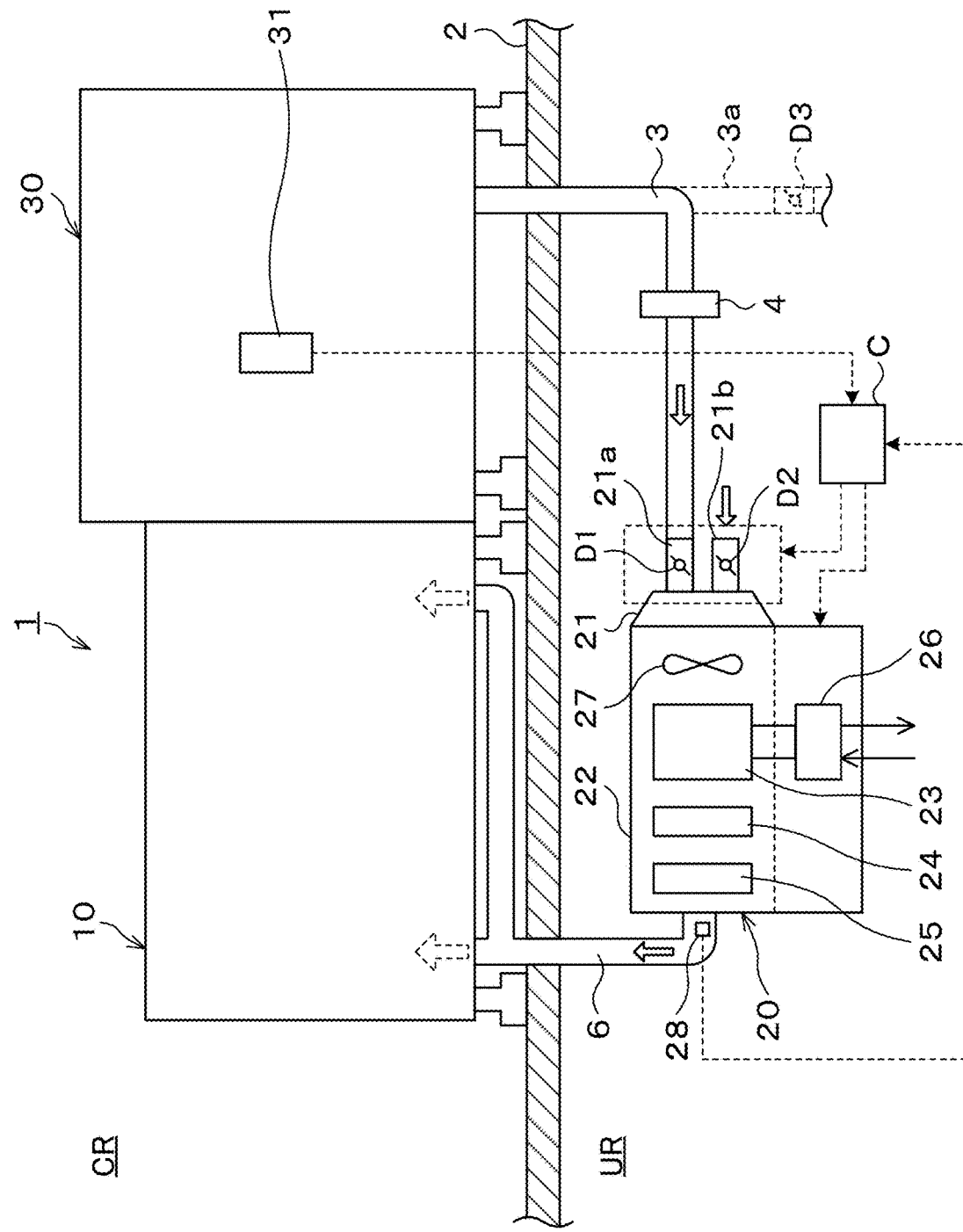
FIG. 4 is an explanatory view schematically illustrating a configuration of a substrate treatment system according to a third embodiment.

In this case, a temperature sensor 31 may be provided in a predetermined region in the exposure apparatus 30 as illustrated in FIG. 4, namely, a region which possibly lacks exhaust heat when the flow rate of the emission gas becomes too low, so that the control device C may control the closing limit (tightening degree) of the damper D1 of the first intake part 21a based on a temperature signal from the temperature sensor 31. This can set the intake volume of the emission gas from the exposure apparatus 30 to an adequate volume.

Besides, in the case where the source gas do not fall within the controllable ranges of the temperature and humidity regulation in the supply apparatus 20 unless the damper D1 of the first intake part 21a is tightened exceeding the closing limit of the damper D1, for example, a branch duct 3a may be provided at the duct 3 as illustrated in FIG. 4 so as to separately provide an emission route for the emission gas from the exposure apparatus 30, to thereby emit the emission gas from the branch duct 3a. This can be flexibly coped with by providing a damper D3 which can adjust the opening decree in the branch duct 3a.

Note that the above control device C is a computer including, for example, a CPU, a memory and so on, and has a program storage (not illustrated). This program storage stores a program for controlling the temperature and humidity regulation in the above supply apparatus 20, and the opening, the closing, and the opening degree adjustment of the damper D1 to the damper D3. As a matter of course, the control device C may be shared with a control device which controls various treatment apparatuses and transfer means which are installed in the substrate treatment system 1 and a control device which performs control of various treatments of the exposure apparatus 30. The above program may be the one which is recorded in a computer-readable storage medium and installed in the control device C via the storage medium or over the Internet. Further, part of all of the program may be realized by dedicated hardware (circuit board).

Embodiments have been described above with reference to the drawings, but this disclosure is not limited to the illustrated embodiments. Various changes may be made in the illustrated embodiments within the same scope as this disclosure or within an equivalent scope.

EXPLANATION OF CODES 1 substrate treatment system
10 coating and developing treatment apparatus
20 supply apparatus
21 intake part
30 exposure apparatus

What is claimed is:

1. A substrate treatment system connected to an exposure apparatus, the substrate treatment system comprising:
a substrate treatment apparatus configured to perform a treatment on a substrate; and
a supply apparatus configured to supply atmosphere gas during a substrate treatment to the substrate treatment apparatus, wherein:
the supply apparatus includes an intake part configured to take in emission gas emitted from the exposure apparatus; and
the supply apparatus regulates a temperature and/or a humidity of the emission gas taken in from the intake part and then supplies the emission gas as the atmosphere gas to the substrate treatment apparatus.

2. The substrate treatment system according to claim 1, further comprising
a duct connecting the intake part and the exposure apparatus.

3. The substrate treatment system according to claim 1, further comprising
a remover configured to remove a foreign substance and/or a chemical substance contained in the emission gas before the emission gas is taken into the intake part.

4. The substrate treatment system according to claim 1, wherein:
the intake part includes a first intake part configured to take in the emission gas from the exposure apparatus, and a second intake part configured to take in an atmosphere in an installation area of the substrate treatment system; and
the supply apparatus selects and takes in either the emission gas from the first intake part or the atmosphere in the installation area from the second intake part, regulates a temperature and/or a humidity of the emission gas or the atmosphere, and then supplies the emission gas or the atmosphere as the atmosphere gas to the substrate treatment apparatus.

5. The substrate treatment system according to claim 4, wherein
the supply apparatus selects and takes in either the emission gas from the first intake part or the atmosphere in the installation area from the second intake part based on the temperature and/or the humidity of the emission gas from the exposure apparatus, regulates the temperature and/or the humidity of the emission gas or the atmosphere, and then supplies the emission gas or the atmosphere as the atmosphere gas to the substrate treatment apparatus.

6. The substrate treatment system according to claim 1, wherein
the intake part includes a first intake part configured to take in the emission gas from the exposure apparatus, and a second intake part configured to take in an atmosphere in an installation area of the substrate treatment system; and
the supply apparatus mixes the emission gas from the first intake part and the atmosphere in the installation area from the second intake part, then regulates a temperature and/or a humidity of the mixed emission gas and atmosphere, and then supplies the mixed emission gas and atmosphere as the atmosphere gas to the substrate treatment apparatus.

7. The substrate treatment system according to claim 6, wherein
a mixing ratio of the emission gas from the first intake part and the atmosphere in the installation area from the second intake part is variable.

8. The substrate treatment system according to claim 7, wherein
the mixing ratio is decided based on the temperature and/or the humidity of the emission gas from the exposure apparatus.

9. The substrate treatment system according to claim 1, wherein
an intake volume of the emission gas emitted from the exposure apparatus is adjusted based on a temperature in the exposure apparatus.

10. A substrate treatment method using a substrate treatment system connected to an exposure apparatus, the method comprising
regulating a temperature and/or a humidity of emission gas emitted from the exposure apparatus, and then supplying the emission gas as atmosphere gas to a substrate treatment apparatus of the substrate treatment system.

* * * * *